United States Patent
Shingai et al.

(10) Patent No.: US 9,582,130 B2
(45) Date of Patent: Feb. 28, 2017

(54) TRANSPARENT CONDUCTOR AND TOUCH PANEL

(71) Applicant: TDK CORPORATION, Tokyo (JP)

(72) Inventors: Hiroshi Shingai, Tokyo (JP); Minoru Fujita, Tokyo (JP); Masahiro Oishi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 14/600,746

(22) Filed: Jan. 20, 2015

(65) Prior Publication Data

US 2015/0205409 A1 Jul. 23, 2015

(30) Foreign Application Priority Data

Jan. 17, 2014 (JP) .................. 2014-006919

(51) Int. Cl.
| | |
|---|---|
| *B32B 15/04* | (2006.01) |
| *B32B 17/06* | (2006.01) |
| *G06F 3/044* | (2006.01) |
| *G06F 1/16* | (2006.01) |
| *C23C 14/08* | (2006.01) |
| *C23C 14/34* | (2006.01) |

(52) U.S. Cl.
CPC .............. *G06F 3/044* (2013.01); *C23C 14/08* (2013.01); *C23C 14/3414* (2013.01); *G06F 1/16* (2013.01)

(58) Field of Classification Search
USPC ....... 428/426, 432, 688, 689, 697, 698, 699, 428/701, 702
See application file for complete search history.

(56) References Cited

U.S. PATENT DOCUMENTS

| | | | |
|---|---|---|---|
| 2003/0085649 A1 | 5/2003 | Wachi et al. | |
| 2007/0071985 A1* | 3/2007 | Kumar | .............. C04B 35/01 428/432 |
| 2012/0127113 A1* | 5/2012 | Yau | ............. G06F 3/045 345/174 |
| 2012/0193210 A1* | 8/2012 | Yau | ............. G06F 3/044 200/600 |
| 2013/0277646 A1* | 10/2013 | Saito | ............. H01L 51/52 257/40 |

FOREIGN PATENT DOCUMENTS

| | | |
|---|---|---|
| JP | H09-291355 A | 11/1997 |
| JP | 2007-250430 A | 9/2007 |

* cited by examiner

*Primary Examiner* — Lauren R Colgan
(74) *Attorney, Agent, or Firm* — Oliff PLC

(57) ABSTRACT

The transparent conductor includes a transparent substrate, a first metal oxide layer, a metal layer, and a second metal oxide layer laminated. At least one of the first and the second metal oxide layers contains four components of $Al_2O_3$, ZnO, $SnO_2$, and $Ga_2O_3$. X, Y, and Z are within a region surrounded by line segments between point a, point b, point c, point d, point e, and point f, in terms of (X, Y, Z) coordinates shown in a ternary diagram in FIG. 2, or on the line segments where X is a total molar ratio of the $Al_2O_3$ and the ZnO, Y is a molar ratio of the $SnO_2$, and Z is a molar ratio of the $Ga_2O_3$, relative to the total amount of the four components. A molar ratio of the $Al_2O_3$ relative to the total amount of the four components is 1.5 to 3.5% by mole.

2 Claims, 5 Drawing Sheets

TRANSPARENT CONDUCTOR AND TOUCH PANEL

CROSS REFERENCE TO RELATED APPLICATIONS

This application is based upon and claims the benefit of priority from Japanese Patent Application No. 2014-006919, filed on Jan. 17, 2014, the entire contents of which are incorporated herein by reference.

BACKGROUND

Field

This disclosure relates to a transparent conductor and a touch panel including the conductor.

Description of the Related Art

Transparent conductors, which have transparency and electric conductivity, have been used as transparent electrodes for displays such as liquid crystal displays (LCDs), plasma display panels (PDPs), and electroluminescence (organic EL and inorganic EL) panels and for solar cells, for example. In addition, the transparent conductors have been also used for electromagnetic wave shielding films and infrared ray shielding films, for example.

The transparent conductor is exemplified by ITO prepared by adding tin (Sn) to indium oxide ($In_2O_3$), GZO prepared by adding gallium (Ga) to zinc oxide (ZnO), and materials prepared by adding antimony (Sb) to tin oxide ($SnO_2$). Among them, ITO has been widely used.

In recent years, terminals including a touch panel, such as smartphones and tablet terminals have rapidly become popular. In such a terminal, a touch sensor is provided on a liquid crystal panel, and a cover glass is disposed on the outermost face. The touch sensor includes one or two glass or film substrates that are bonded together. On one or both sides of the substrate, an ITO film is formed by sputtering.

The transparent conductor for touch panels is required to have higher visible light transmittance than those for other applications. The sensitivity of human eyes to light varies with a wavelength of the light, and reaches the maximum at a wavelength of 555 nm. Thus, the transparent conductor for touch panels is required to have a high transmittance at a wavelength of 555 nm.

As smartphones, tablet terminals, and PCs with a touch sensor have become popular, touch panels are rapidly becoming larger. The large touch panels are required to have lower resistance while maintaining high transmittance. In addition, the larger touch panels have lager weights, and thus weight reduction by replacing a glass substrate on which the transparent conductor is provided with a film substrate has been studied.

To achieve an ITO film having a lower resistance, the ITO film is required to have a larger thickness or to be thermally annealed for crystallization. An ITO film having a larger thickness unfortunately has a lower transmittance. In addition, film substrates are difficult to be thermally annealed at a high temperature. On this account, the ITO film provided on a film substrate is difficult to have lower resistance while maintaining high transmittance.

In such circumstances, a multilayer transparent conductor having a multilayer structure of a metal oxide layer and a metal layer has been developed. In recent years, the exhaustion of the resource of indium (In), which is a rare earth element, has been a concern, and thus there is a demand for a transparent conductor including no In but satisfying various characteristics. As the material for such a transparent conductor, zinc oxide (ZnO) has been studied.

For example, Patent Document 1 (Japanese Patent Application Laid-Open Publication No. 9-291355) discloses a laminate in which a transparent oxide (GZO) layer prepared by adding Ga to ZnO, a layer of a metal such as silver (Ag), and a GZO transparent oxide layer are stacked. Patent Document 2 (Japanese Patent Application Laid-Open Publication No. 2007-250430) discloses a laminate including a Zn—Sn—O oxide film, a film prepared by adding Ga or Al to the Zn—Sn—O oxide, and a metal film mainly containing Ag.

SUMMARY

According to the studies by the inventors of the present invention, when such a laminate as described in Patent Document 1 is left in an environment at high temperature and humidity, the laminate may become cloudy because ZnO has low moisture resistance. The Zn—Sn—O oxide film or the film prepared by adding Ga or Al to the Zn—Sn—O oxide as disclosed in Patent Document 2 may be difficult to be etched. The material difficult to be etched makes patterning difficult in applications such as touch panels, and thus the application is limited.

In view of the above circumstances, an object of the present invention is to provide a transparent conductor having a low surface resistance and a high total light transmittance at a wavelength of 555 nm and having excellent etching characteristics and storage reliability. The present invention has another object to provide a touch panel achieving clear display and having excellent storage reliability by using the transparent conductor.

An aspect of the present invention provides a transparent conductor including, a transparent substrate, a first metal oxide layer, a metal layer, and a second metal oxide layer laminated in this order. At least one of the first metal oxide layer and the second metal oxide layer contains four components of $Al_2O_3$, ZnO, $SnO_2$, and $Ga_2O_3$. X, Y, and Z are within a region surrounded by line segments between point a (71.2, 3.8, 25.0), point b (85.5, 4.5, 10.0), point c (76.0, 19.0, 5.0), point d (66.5, 28.5, 5.0), point e (59.5, 25.5, 15.0), and point f (67.5, 7.5, 25.0), in terms of (X, Y, Z) coordinates shown in a ternary diagram in FIG. 2, or on the line segments where X is a total molar ratio of the $Al_2O_3$ and the ZnO, Y is a molar ratio of the $SnO_2$, and Z is a molar ratio of the $Ga_2O_3$, relative to the total amount of the four components. A molar ratio of the $Al_2O_3$ relative to the total amount of the four components is 1.5 to 3.5% by mole.

The transparent conductor of the present invention has a low surface resistance and a high total light transmittance at a wavelength of 555 nm, and has excellent etching characteristics and storage reliability even when it contains no indium (In).

Another aspect of the present invention provides a touch panel including a panel plate and a sensor film that is opposite to the panel plate and is the transparent conductor according to the above aspect.

Such a touch panel includes the transparent conductor having the above-mentioned characteristics and thus achieves clear display and has excellent storage reliability.

The present invention can provide a transparent conductor having a low surface resistance and a high total light transmittance at a wavelength of 555 nm and having excellent etching characteristics and storage reliability. By using such a transparent conductor, the present invention can provide a touch panel achieving clear display and having excellent storage reliability.

DETAILED DESCRIPTION

Figure 1:
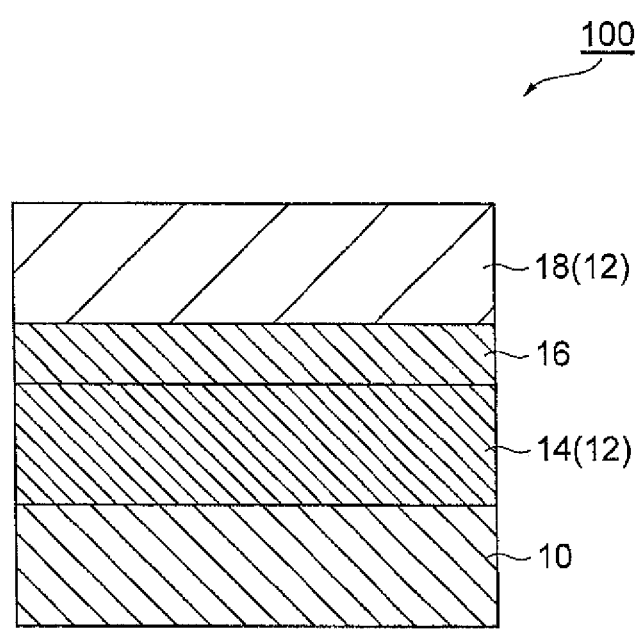
FIG. 1 is a schematic sectional view showing an embodiment of a transparent conductor of the present invention.

Various embodiments of the present invention will be described in detail with reference to drawings. The present invention is not intended to be limited to the following embodiments. In the drawings, the same or equivalent elements are indicated by the same sign, and duplicated explanations may be omitted.

FIG. 1 is a schematic sectional view showing an embodiment of a transparent conductor. The transparent conductor 100 has a multilayer structure in which a film-based transparent substrate 10, a metal oxide layer 12, a metal layer 16, and another metal oxide layer 12 are sequentially stacked. In other words, the metal layer 16 is disposed between a pair of the metal oxide layers 12. Of the pair of the metal oxide layers 12, the layer disposed on the transparent substrate 10 is called a first metal oxide layer 14, and the layer disposed apart from the transparent substrate 10 across the first metal oxide layer 14 is called a second metal oxide layer 18.

In the present specification, the term "transparent" means transmitting visible light, where a part of incident light may be scattered. The required level of scattering light varies with applications of the transparent conductor 100. A common translucent substance, which scatters light, is also encompassed in the concept of "transparent" in the present specification. The degree of scattering light is preferably as small as possible, and the transparency is preferably as high as possible. The transparent conductor 100 has a total light transmittance of, for example, 86% or more and preferably 90% or more as a whole.

The transparent substrate 10 is not limited to particular substrates and may be a flexible organic resin film. The organic resin film may be an organic resin sheet. Examples of the organic resin film include films of polyester such as polyethylene terephthalate (PET) and polyethylene naphthalate (PEN), films of polyolefin such as polyethylene and polypropylene, polycarbonate films, acrylic films, norbornene films, polyarylate films, polyethersulfone films, diacetylcellulose films, and triacetyl cellulose films. Among them, the polyester films such as polyethylene terephthalate (PET) films and polyethylene naphthalate (PEN) films are preferred.

The transparent substrate 10 preferably has a large thickness in terms of rigidity. For a thinner transparent conductor 100, the transparent substrate 10 preferably has a small thickness. From such viewpoints, the transparent substrate 10 has a thickness of 10 to 200 μm, for example. The transparent substrate has a refractive index of, for example, 1.50 to 1.70 in order to produce a transparent conductor having excellent optical characteristics. In the present specification, the refractive index is determined in a condition at a wavelength, λ, of 633 nm and a temperature of 20° C.

The transparent substrate 10 preferably has high dimensional stability during heating. A common flexible organic resin film is expanded or shrunk by heat during film production, causing dimensional change. By uniaxial stretching or biaxial stretching, a thin transparent substrate 10 can be produced at low cost. When heated for forming an extraction electrode, the transparent conductor 100 is thermally shrunk to cause dimensional change. Such a dimensional change can be measured in accordance with ASTM D1204-02 or JIS-C-2151. The dimensional change ratio before and after heat treatment is calculated in accordance with the following equation, where the size before heating is Lo and the size after heating is L.

Dimensional change ratio (%)=100×($L-Lo$)/$Lo$

A sample having a positive dimensional change ratio (%) represents that the sample has been expanded by heat treatment, and a sample having a negative dimensional change ratio (%) represents that the sample has been shrunk by heat treatment. The dimensional change ratio of a biaxially stretched transparent substrate 10 can be measured in both a machine direction (MD) and a transverse direction (TD) in the stretching. The transparent substrate 10 has a dimensional change ratio of −1.0 to −0.3% in a MD and a dimensional change ratio of −0.1 to +0.1% in a TD, for example.

The transparent substrate 10 may be a substrate that is surface treated by at least one treatment selected from the group consisting of corona discharge treatment, glow discharge treatment, flame treatment, ultraviolet irradiation treatment, electron beam irradiation treatment, and ozone treatment. The transparent substrate may be a resin film. The use of the resin film allows the transparent conductor 100 to have excellent flexibility. Such a flexible transparent conductor is usable as not only the transparent conductors for touch panels but also transparent electrodes and electromagnetic wave shields for flexible organic EL lightings and other devices.

For example, for a transparent conductor 100 used as the sensor film constituting a touch panel, the transparent substrate 10 is preferably such a flexible organic resin film that the sensor film can be appropriately deformed by an external input with a finger or a pen. For a transparent conductor 100 used as an inner transparent electrode panel plate disposed opposite to the transparent electrode panel plate on the input side (surface side), the transparent substrate 10 may be a glass plate without flexibility because the transparent conductor 100 is required to have no flexibility.

The metal oxide layer 12 is a transparent layer containing an oxide, and the oxide includes four components of $Al_2O_3$, $ZnO$, $SnO_2$, and $Ga_2O_3$. The metal oxide layer 12 has functions of adjusting optical characteristics, protecting the metal layer 16, and achieving electric conductivity. The metal oxide layer 12 may contain trace components and unavoidable components in addition to the four components within a range not significantly impairing the functions. In order to produce the transparent conductor 100 having sufficiently high characteristics, the metal oxide layer 12 preferably contains the four components at a higher total ratio. The total ratio of the four components is 99% by mass or more, for example.

Figure 2:
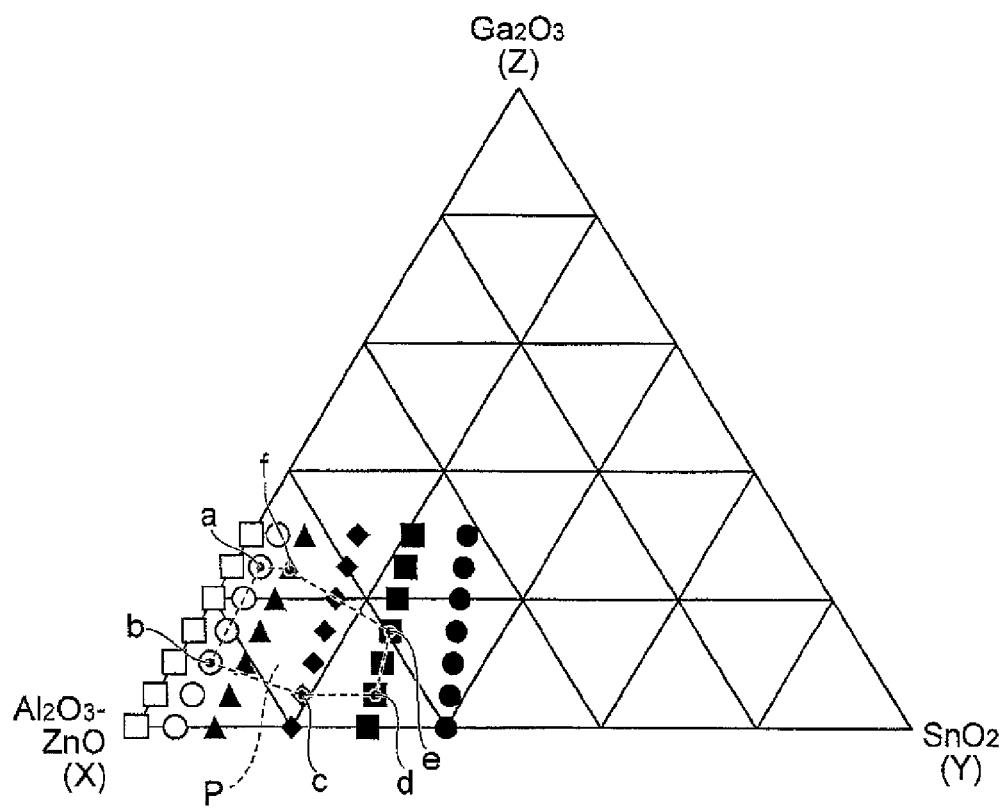
FIG. 2 is a ternary diagram showing compositions of metal oxide layers in an embodiment of the transparent conductor of the present invention.

The metal oxide layer 12 has such a composition that X, Y, and Z are within the region surrounded by line segments (dotted lines) between point a, point b, point c, point d, point e, and point f, in terms of (X, Y, Z) coordinates shown in FIG. 2, or on the line segments (boundary lines) where the $Al_2O_3$ has a molar ratio of α (% by mole), the ZnO has a molar ratio of β (% by mole), the $SnO_2$ has a molar ratio of Y (% by mole), the $Ga_2O_3$ has a molar ratio of Z (% by mole), relative to the total amount of the four components, and α+β is X. Here, α, β, Y, and Z satisfy the equation, α+β+Y+Z=100.

Point a (71.2, 3.8, 25.0)
Point b (85.5, 4.5, 10.0)
Point c (76.0, 19.0, 5.0)
Point d (66.5, 28.5, 5.0)
Point e (59.5, 25.5, 15.0)
Point f (67.5, 7.5, 25.0)

In the composition, the molar ratio of the $Al_2O_3$, or the value of α/(X+Y+Z), is 1.5 to 3.5% by mole relative to the total amount of the four components. If having a value of α/(X+Y+Z) of less than 1.5% by mole or more than 3.5% by mole, the metal oxide layer 12 has a lower electric conductivity and cannot reduce the surface resistance. This is considered to be because a metal oxide layer 12 not having a value of α/(X+Y+Z) of 1.5 to 3.5% by mole becomes insulating state.

FIG. 2 is a ternary diagram showing a composition of the metal oxide layer 12 where a vertex indicates a composition containing $Al_2O_3$ and ZnO alone, another vertex indicates a composition containing $SnO_2$ alone, and the other vertex indicates a composition containing $Ga_2O_3$ alone. In other words, in order to represent the four components of $Al_2O_3$, ZnO, $Ga_2O_3$, and $SnO_2$ in terms of triangular coordinates, the total composition of $Al_2O_3$ and ZnO, $Al_2O_3$+ZnO, is regarded as a single component, and three vertexes indicate the corresponding three components of $Al_2O_3$+ZnO, $SnO_2$, and $Ga_2O_3$. By using the ternary diagram in FIG. 2, the composition in the metal oxide layer 12 of the embodiment can be represented by the triangular coordinates, X, Y, and Z. In FIG. 2, the point a, the point b, the point c, the point d, the point e, and the point f are plotted. The metal oxide layer 12 has a composition within the region (region P) surrounded by the line segments between adjacent two points or on the line segments. The line segments form the boundary lines of the region.

The point a is a point at a $Ga_2O_3$ ratio of 25% by mole on the line passing through the point corresponding to the composition of $(Al_2O_3—ZnO)_{95}(SnO_2)_5(Ga_2O_3)_0$ and the point corresponding to the composition of $(Ga_2O_3)_{100}$, and the point b is a point at a $Ga_2O_3$ ratio of 10% by mole on the same line. The point c is a point at a $Ga_2O_3$ ratio of 5% by mole on the line passing through the point corresponding to the composition of $(Al_2O_3—ZnO)_{80}(SnO_2)_{20}(Ga_2O_3)_0$ and the point corresponding to the composition of $(Ga_2O_3)_{100}$. The point d is a point at a $Ga_2O_3$ ratio of 5% by mole on the line passing through the point corresponding to the composition of $(Al_2O_3—ZnO)_{70}(SnO_2)_{30}(Ga_2O_3)_0$ and the point corresponding to the composition of $(Ga_2O_3)_{100}$, and the point e is a point at a $Ga_2O_3$ ratio of 15% by mole on the same line. The point f is a point at a $Ga_2O_3$ ratio of 25% by mole on the line passing through the point corresponding to the composition of $(Al_2O_3—ZnO)_{90}(SnO_2)_{10}(Ga_2O_3)_0$ and the point corresponding to the composition of $(Ga_2O_3)_{100}$. The subscript numeric characters subsequent to parentheses indicate the molar ratios of the corresponding components.

The metal oxide layer 12 has a thickness of 20 to 70 nm, which is suited for various touch panels, for example.

The metal oxide layer 12 can be prepared by a vacuum film formation process such as vacuum deposition, sputtering, ion plating, and CVD process. Among them, the sputtering is preferred because a film formation chamber can be downsized and the film formation speed is high. The sputtering is exemplified by DC magnetron sputtering. Usable targets are oxide targets, metal targets, and metalloid targets.

Of the metal oxide layers 12, the thickness, the configuration, and the composition of the first metal oxide layer 14 provided on the transparent substrate 10 may be the same as or different from those of the second metal oxide layer 18 provided apart from the transparent substrate 10.

On the second metal oxide layer 18, wiring electrodes may be provided, for example. An electric current passing through the metal layer 16 described later passes through the second metal oxide layer 18 and is led to the wiring electrodes or the like provided on the second metal oxide layer 18. On this account, the second metal oxide layer 18 preferably has high electric conductivity. From such viewpoints, the second metal oxide layer 18 may have a specific resistance of 1,000 Ω·cm or less and may have a specific resistance of 100 Ω·cm or less, for example.

The metal layer 16 is a layer mainly containing metal. The metal layer 16 has high electric conductivity, which allows the transparent conductor to have a sufficiently low surface resistance. The metal is preferably silver (Ag) or an alloy containing silver (Ag alloy). The metal layer 16 has functions of adjusting the total light transmittance and the resistance value of the transparent conductor 100. Ag is a metal having a high total light transmittance at a wavelength of 555 nm and having a low resistance value. The metal layer 16 preferably contains trace additives in order to sufficiently suppress migration and corrosion in harsh, high temperature and high humidity conditions.

The metallic element constituting the Ag alloy is exemplified by at least one element selected from Au, Pd, Nd, Bi, Cu, Sb, Bi, In, Sn, Ge, Nb, Ti, Ru, Al, Ga, and Gd. Examples of the preferred Ag alloy include Ag—Pd, Ag—Cu, Ag—Bi, Ag—Nd, Ag—In, and Ag—Nb. Such an Ag alloy may contain additives. Thus, the metal layer 16 may contain three or more metallic elements. The amount of the additives contained in the metal layer 16 is 0.3 to 2.5% by weight, for example. If containing the additive in an amount of less than 0.3% by weight, the metal layer is unlikely to exert the effect of improving corrosion resistance. If containing the additive in an amount of more than 2.5% by weight, the metal layer is likely to lower the total light transmittance or is likely to increase the resistance value. The metal layer 16 has a thickness of, for example, 3 to 15 nm, which is suited for various applications.

The metal layer 16 can be prepared by a vacuum film formation process such as vacuum deposition, sputtering, ion plating, and CVD process. Among them, the sputtering is preferred because a film formation chamber can be downsized and the film formation speed is high. The sputtering is exemplified by DC magnetron sputtering. Usable targets are metal targets.

Figure 3:
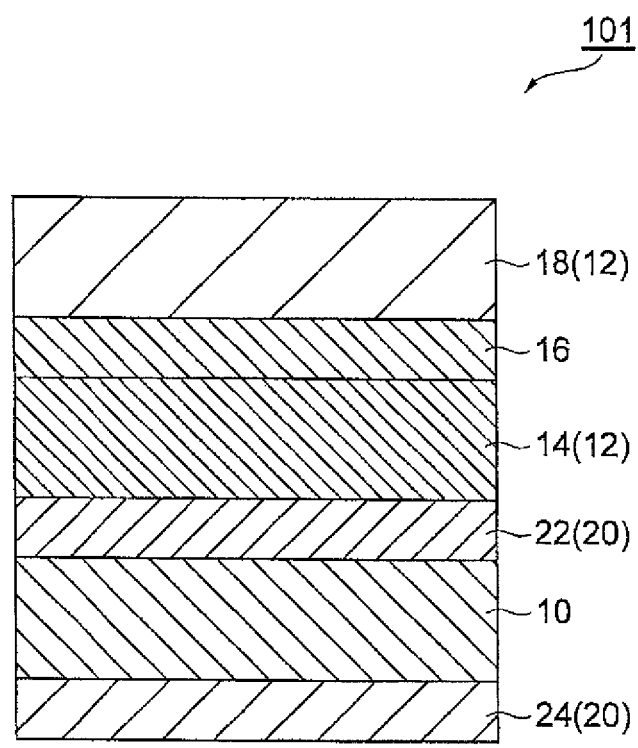
FIG. 3 is a schematic sectional view showing another embodiment of the transparent conductor of the present invention.

FIG. 3 is a schematic sectional view showing another embodiment of the transparent conductor of the present invention. The transparent conductor 101 includes a pair of hard coat layers 20 interposing the transparent substrate 10 and differs from the transparent conductor 100 in this configuration. The other configuration is the same as that of the transparent conductor 100.

The transparent conductor 101 includes, as the pair of hard coat layers 20, a first hard coat layer 22 on a principal surface of the transparent substrate 10 facing the first metal oxide layer 14 and a second hard coat layer 24 on the other principal surface of the transparent substrate 10 opposite to the first metal oxide layer 14. In other words, the transparent conductor 101 has a multilayer structure in which the second hard coat layer 24, the transparent substrate 10, the first hard coat layer 22, the first metal oxide layer 14, the metal layer 16, and the second metal oxide layer 18 are stacked in this order. The thickness, the configuration, and the composition of the first hard coat layer 22 may be the same as or different from those of the second hard coat layer 24. The transparent conductor 101 does not necessarily include both the first hard coat layer 22 and the second hard coat layer 24 and may include one of them.

The hard coat layer 20 provided can sufficiently prevent the transparent substrate 10 from receiving scratches. The hard coat layer 20 contains a cured resin obtained by curing a resin composition. The resin composition preferably contains at least one composition selected from thermosetting resin compositions, ultraviolet curable resin compositions, and electron beam curable resin compositions. The thermosetting resin composition may contain at least one resin selected from epoxy resins, phenoxy resins, and melamine resins.

The resin composition is a composition containing a curable compound having an energy ray reactive group such as a (meth)acryloyl group and a vinyl group. The expression, (meth)acryloyl group, encompasses at least one of an acryloyl group and a methacryloyl group. The curable compound preferably contains a polyfunctional monomer or an oligomer having two or more, preferably three or more energy ray reactive groups in one molecule.

The curable compound preferably contains an acrylic monomer. Examples of the acrylic monomer specifically include 1,6-hexanediol di(meth)acrylate, triethylene glycol di(meth)acrylate, ethylene oxide-modified bisphenol A di(meth)acrylate, trimethylolpropane tri(meth)acrylate, trimethylolpropane ethylene oxide-modified tri(meth)acrylate, trimethylolpropane propylene oxide-modified tri(meth)acrylate, pentaerythritol tetra(meth)acrylate, ditrimethylolpropane tetra(meth)acrylate, dipentaerythritol penta(meth)acrylate, dipentaerythritol hexa(meth)acrylate, pentaerythritol tri(meth)acrylate, and 3-(meth)acryloyloxyglycerin mono(meth)acrylate. The acrylic monomer is not necessarily limited to the above examples. For example, urethane-modified acrylate and epoxy-modified acrylate are also exemplified.

The curable compound may be a compound having a vinyl group. Examples of the compound having a vinyl group include, but are not necessarily limited to, ethylene glycol divinyl ether, pentaerythritol divinyl ether, 1,6-hexanediol divinyl ether, trimethylolpropane divinyl ether, ethylene oxide-modified hydroquinone divinyl ether, ethylene oxide-modified bisphenol A divinyl ether, pentaerythritol trivinyl ether, dipentaerythritol hexavinyl ether, and ditrimethylolpropane polyvinyl ether.

When containing a curable compound to be cured by ultraviolet light, the resin composition contains a photoinitiator. Various photoinitiators can be used. For example, the photoinitiator can be appropriately selected from known compounds such as acetophenone photoinitiators, benzoin photoinitiators, benzophenone photoinitiators, and thioxanthone photoinitiators. More specifically, examples include Darocur 1173, Irgacure 651, Irgacure 184, Irgacure 907 (trade names, manufactured by Ciba Specialty Chemicals), and KAYACURE DETX-S (trade name, manufactured by Nippon Kayaku Co., Ltd.).

The photoinitiator is contained in an amount of about 0.01 to 20% by weight or about 0.5 to 5% by weight relative to the weight of the curable compound. The resin composition may be a known composition containing the acrylic monomer and the photoinitiator. Examples of the composition containing the acrylic monomer and the photoinitiator include ultraviolet curable resins such as SD-318 (trade name, manufactured by Dainippon Ink and Chemicals, Inc.) and XNR5535 (trade name, manufactured by Nagase & Co., Ltd.).

The resin composition may contain organic microparticles and/or inorganic microparticles in order to increase the strength of a coating and/or to adjust the refractive index. Examples of the organic microparticles include organic silicon microparticles, crosslinked acrylic microparticles, and crosslinked polystyrene microparticles. Examples of the inorganic microparticles include silicon oxide microparticles, aluminum oxide microparticles, zirconium oxide microparticles, titanium oxide microparticles, and iron oxide microparticles. Among them, the silicon oxide microparticles are preferred.

The microparticles are preferably microparticles that are surface treated with a silane coupling agent, thereby having a film of an energy ray reactive group such as a (meth)acryloyl group and/or a vinyl group on the surface. If used, such reactive microparticles react with each other or with a polyfunctional monomer or an oligomer during energy ray irradiation, and the reaction can increase the strength of the film. The silicon oxide microparticles treated with a silane coupling agent and containing a (meth)acryloyl group are preferably used.

The microparticles may have an average particle size of 100 nm or smaller or 20 nm or smaller, which is smaller than the thickness of the hard coat layer 20 and achieves sufficient transparency. The average particle size may be 5 nm or larger or may be 10 nm or larger in terms of production of a colloidal solution. When the organic microparticles and/or the inorganic microparticles are used, the total amount of the organic microparticles and the inorganic microparticles may be, for example, 5 to 500 parts by weight or may be 20 to 200 parts by weight relative to 100 parts by weight of the curable compound.

If used, the energy ray curable resin composition can be cured by irradiation with energy rays such as ultraviolet light. Thus, such a resin composition is preferably used in terms of production processes.

The first hard coat layer 22 can be prepared by applying a solution or dispersion liquid of the resin composition on one face of the transparent substrate 10, then drying the solution or dispersion liquid, and curing the resin composition. The application for the first hard coat layer can be performed by a known coating method. Examples of the coating method include extrusion nozzle coating, blading, knife coating, bar coating, kiss coating, kiss reverse coating, gravure roll coating, dipping, reverse roll coating, direct roll coating, curtain coating, and squeeze coating. The second hard coat layer 24 can also be prepared on the other face of the transparent substrate 10 in the same manner as for the first hard coat layer 22.

The first hard coat layer 22 and the second hard coat layer 24 have a thickness of 0.5 to 10 μm, for example. A layer having a thickness of more than 10 μm is likely to have an uneven thickness, wrinkles, or other defects. A layer having a thickness of less than 0.5 μm may fail to sufficiently prevent a low molecular component such as plasticizers and oligomers from bleeding out if the transparent substrate 10 contains such a component in a significant amount. In order to suppress warpage, the thicknesses of the first hard coat layer 22 and the second hard coat layer 24 are preferably, substantially the same.

The first hard coat layer 22 and the second hard coat layer 24 have a refractive index of 1.40 to 1.60, for example. The absolute value of the difference in refractive index between the transparent substrate 10 and the first hard coat layer 22 is preferably 0.1 or less. The absolute value of the difference in refractive index between the transparent substrate 10 and the second hard coat layer 24 is also preferably 0.1 or less. By reducing the absolute values of the differences in refractive index between the first hard coat layer 22 and the transparent substrate 10 and between the second hard coat layer 24 and the transparent substrate 10, uneven interference, which is caused by uneven thicknesses of the first hard coat layer 22 and the second hard coat layer 24, can be suppressed.

The thickness of each layer constituting the transparent conductors 100 and 101 can be determined by the following procedure. The transparent conductor 100 is cut with a focused ion beam (FIB) system, giving a cross section. The cross section is observed under a transmission electron microscope (TEM), and the thickness of each layer is determined. It is preferred that the measurement be carried out at ten or more points, which have been arbitrarily selected, and the average be calculated. To give the cross section, a microtome may be used as a system other than the focused ion beam system. To determine the thickness, a scanning electron microscope (SEM) may be used. An X-ray fluorescence spectrometer can also be used to determine the film thickness.

The transparent conductors 100 and 101 may have a thickness of 200 µm or less or may have a thickness of 150 µm or less. If having such a thickness, the transparent conductor can sufficiently satisfy a thinning level demanded. The transparent conductors 100 and 101 can have a high total light transmittance at a wavelength of 555 nm of 85% or more, for example. In addition, the surface resistance can be suppressed to, for example, 30 Ω/sq. or less and can be further suppressed to 20 Ω/sq. or less.

The transparent conductors 100 and 101 having the above-mentioned configuration have a composition that is within the region surrounded by the point a, the point b, the point c, the point d, the point e, and the point f shown in FIG. 2 or on the boundary lines of the region, and the molar ratio of $Al_2O_3$, or the value of $\alpha/(X+Y+Z)$, is 1.5 to 3.5% by mole relative to the total amount of the four components. The transparent conductors 100 and 101, which include, in addition to the metal layer 16, the first metal oxide layer 14 and/or the second metal oxide layer 18 having such a composition, have a high total light transmittance at a wavelength of 555 nm and have a low surface resistance, excellent etching characteristics, and excellent storage reliability. Such transparent conductors 100 and 101 can provide a touch panel achieving clear display and having excellent storage reliability.

Figure 4:
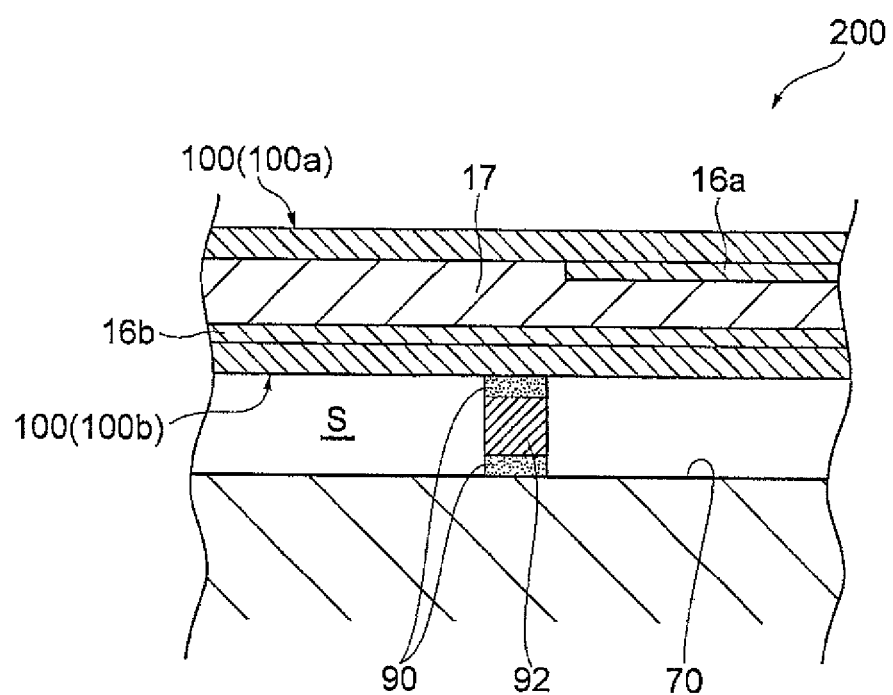
FIG. 4 is a partially enlarged schematic sectional view showing an embodiment of a touch panel.
Figure 5:
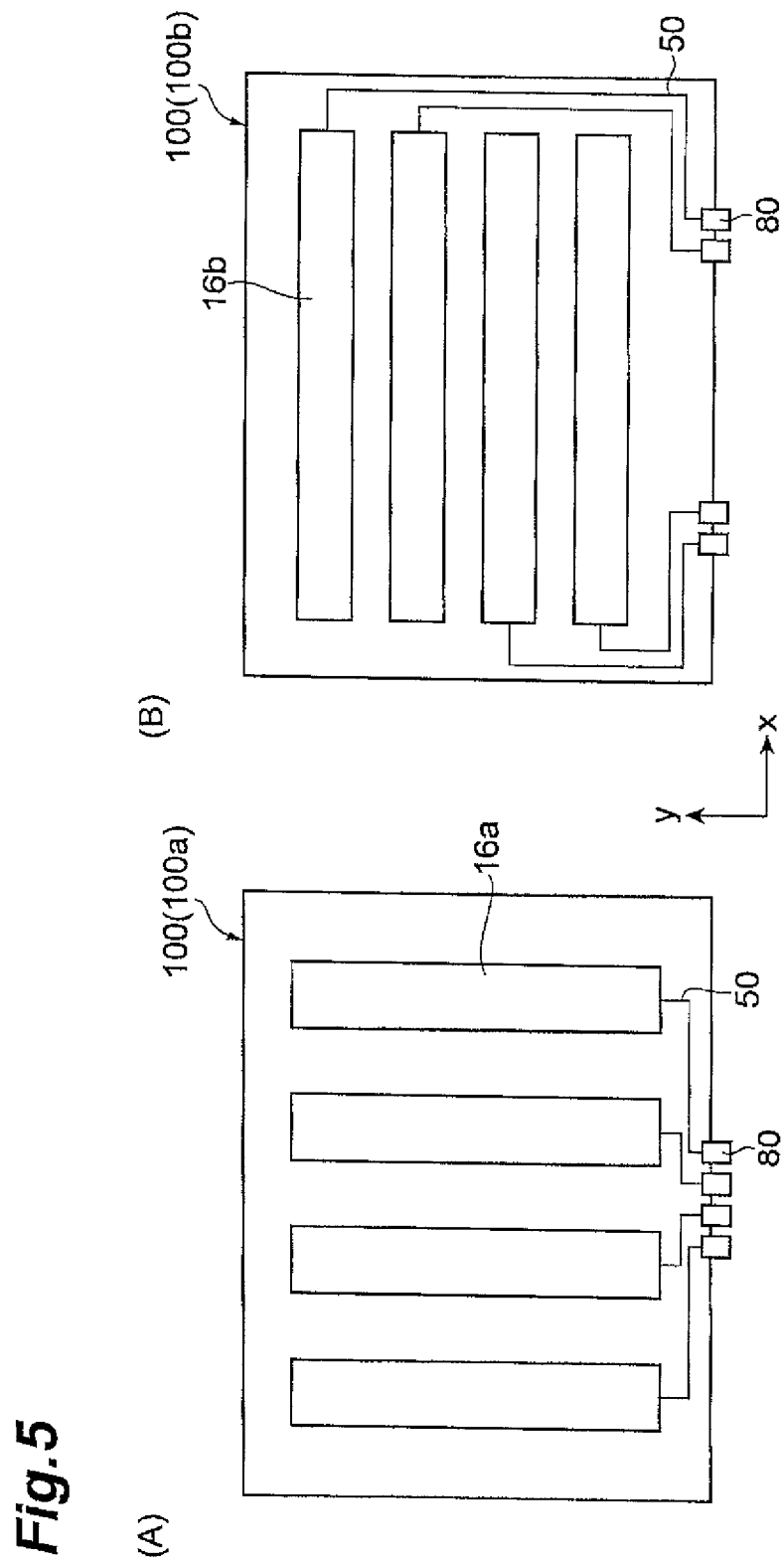
FIG. 5 is a plan view of sensor films constituting of an embodiment of the touch panel.

FIG. 4 is a partially enlarged schematic sectional view showing a touch panel 200 including a pair of sensor films. FIG. 5 is a plan view of the sensor films included in the touch panel. (A) and (B) in FIG. 5 show sensor films 100a and 100b each including the above-mentioned transparent conductor 100. The touch panel 200 includes a pair of the sensor films 100a and 100b opposite to each other through an optical adhesive 17. The touch panel 200 is configured in such a manner that the touch position of a contact body can be calculated as a coordinate position (a position in the transverse direction and a position in the longitudinal direction) on a plane that has two-dimensional coordinates (X-Y coordinates) and is parallel with the panel plate 70 as a screen.

Specifically, the touch panel 200 includes a sensor film 100a (hereinafter called "Y-axis sensor film") for detecting a position in the longitudinal direction and a sensor film 100b (hereinafter called "X-axis sensor film") for detecting a position in the transverse direction bonded through the optical adhesive 17. On the lower face of the X-axis sensor film 100b, a spacer 92 is provided between the X-axis sensor film 100b and the panel plate 70 as the display.

The Y-axis sensor film 100a for detecting a position in the longitudinal direction and the X-axis sensor film 100b for detecting a position in the transverse direction are composed of the above-mentioned transparent conductor 100. Specifically, the Y-axis sensor film 100a includes sensor electrodes 16a on its face facing the X-axis sensor film 100b. The sensor electrode 16a is composed of the metal oxide layer 12 and the metal layer 16. As shown in (A) in FIG. 5, a plurality of the sensor electrodes 16a extend in the longitudinal direction (y direction) so as to detect a touch position in the longitudinal direction (y direction). A plurality of the sensor electrodes 16a are arranged in parallel with each other along the longitudinal direction (y direction). One end of the sensor electrode 16a is connected to an electrode 80 of a driving IC through a conductor line 50 formed of a silver paste.

The X-axis sensor film 100b for detecting a position in the transverse direction includes sensor electrodes 16b on its face facing the Y-axis sensor film 100a. The sensor electrode 16b is composed of the metal oxide layer 12 and the metal layer 16. As shown in (B) in FIG. 5, a plurality of the sensor electrodes 16b extend in the transverse direction (x direction) so as to detect a touch position in the transverse direction (x direction). A plurality of the sensor electrodes 16b are arranged in parallel with each other along the transverse direction (x direction). One end of the sensor electrode 16b is connected to an electrode 80 of the driving IC through a conductor line 50 formed of a silver paste.

The Y-axis sensor film 100a and the X-axis sensor film 100b are stacked through the optical adhesive 17 in such a manner that the sensor electrodes 16a are orthogonal and face the sensor electrodes 16b, forming the touch panel 200. The conductor lines 50 and the electrodes 80 are composed of an electrically conductive material such as metal (for example, Ag). The conductor lines 50 and the electrodes 80 are formed by patterning through screen printing, for example. The transparent substrate 10 also serves as a protection film covering the surface of the touch panel 200.

The shapes and the numbers of the sensor electrodes 16a and 16b in the corresponding sensor films 100a and 100b are not limited to those shown in FIG. 4, and (A) and (B) in FIG. 5. For example, a larger number of sensor electrodes 16a and 16b can be used to increase the detection accuracy of the touch position.

On the face of the X-axis sensor film 100b opposite to the Y-axis sensor film 100a, a panel plate 70 is provided through spacers 92. The spacers 92 can be provided at positions corresponding to the shapes of the sensor electrodes 16a and 16b and at positions surrounding the entire sensor electrodes 16a and 16b. The spacer 92 may be composed of a transparent material such as a polyethylene terephthalate (PET) resin. One end of the spacer 92 is bonded to the lower face of the X-axis sensor film 100b through a translucent adhesive 90 such as an optical adhesive, an acrylic adhesive, and an epoxy adhesive. The other end of the spacer 92 is bonded to the panel plate 70 of a display through the adhesive 90. Such an arrangement of the X-axis sensor film 100b opposite to the panel plate 70 through the spacer 92 enables the formation of a space S between the X-axis sensor film 100b and the panel plate 70 of a display.

To the electrode 80, a controller (IC) is electrically connected. When the Y-axis sensor film 100a of the touch panel 200 is pressed by a contact body, the X-axis sensor film 100b and the Y-axis sensor film 100a are bent to bring the sensor electrodes 16a and 16b closer to the panel plate 70 of a display. The controller can measure each capacitance change of the sensor electrodes 16a and 16b generated by the deformation, and calculate the touch position (the intersection of the point in the X axis direction and the point in the Y axis direction) of the contact body as a coordinate position on the basis of the measurement results. In addition to the above method, the driving method of the sensor electrode and the calculation method of the coordinate position can be various known methods.

The touch panel 200 can be produced by the following procedure. After the preparation of the transparent conductor 100, the first metal oxide layer 14, the metal layer 16, and the second metal oxide layer 18 are etched, forming a pattern. Specifically, photolithography technique is used to apply a resist material on the surface of the second metal oxide layer 18 by spin coating. The conductor may then be prebaked for improving the adhesion. Subsequently, a mask pattern is disposed, and the conductor is exposed and then developed with a developer, giving a resist pattern. Next, the transparent conductor 100 with the resist pattern is immersed in an acid or alkaline etching solution to dissolve and remove the first metal oxide layer 14, the second metal oxide layer 18, and the metal layer 16 having no resist pattern. The resist is then removed, yielding a Y-axis sensor film 100a with the sensor electrodes 16a and an X-axis sensor film 100b with the sensor electrodes 16b.

Subsequently, a metal paste such as a silver paste is applied, forming conductor lines 50 and electrodes 80. In this manner, the sensor electrodes 16a and 16b are electrically connected to a controller. Next, the Y-axis sensor film 100a is bonded to the X-axis sensor film 100b with an optical adhesive 17 in such a manner that the sensor electrodes 16a are orthogonal to and face the sensor electrodes 16b. Consequently, the touch panel 200 can be produced.

The touch panel 200 includes the transparent conductors 100 as the Y-axis sensor film 100a and the X-axis sensor film 100b and thus satisfactorily has a small thickness. Both the Y-axis sensor film 100a and the X-axis sensor film 100b are not necessarily the transparent conductor 100, and one of the films may be another transparent conductor. Such a touch panel can achieve sufficiently clear display. The sensor film may be the transparent conductor 101 in place of the transparent conductor 100.

As described above, the transparent conductors 100 and 101 can be suitably used for touch panels. The application is not limited to the touch panels. For example, the metal oxide layer 12 and the metal layer 16 are etched into a predetermined shape, forming a part (conductive part) with the metal oxide layer 12 and the metal layer 16 and a part (nonconductive part) without the metal oxide layer 12 or the metal layer 16. Such a product can be used for transparent electrodes, anti-static purposes, and electromagnetic wave shields in various displays such as liquid crystal displays (LCDs), plasma display panels (PDPs), electroluminescence (organic EL, inorganic EL) panels, electrochromic devices, and electronic paper displays. The transparent conductors can also be used as antennas.

Preferred embodiments of the present invention have been described above, but the present invention is not limited to the embodiments. For example, the transparent conductor 101 includes a pair of the hard coat layers 20 but may include one of the first hard coat layer 22 and the second hard coat layer 24. In addition, the transparent conductors 100 and 101 may include optional layers other than the above-mentioned layers at optional positions within a range not significantly impairing the functions.

EXAMPLES

The present invention will now be described more specifically with reference to examples and comparative examples, but is not limited to the examples.

Production Example 1

Production of Transparent Conductor 101

A transparent conductor 101 as shown in FIG. 3 was produced. The transparent conductor 101 had a multilayer structure in which a second hard coat layer 24, a transparent substrate 10, a first hard coat layer 22, a first metal oxide layer 14, a metal layer 16, and a second metal oxide layer 18 were stacked in this order. The transparent conductor 101 was produced by the following procedure.

A polyethylene terephthalate film (manufactured by Toray Industries Inc., product number: U48) having a thickness of 100 μm was prepared. This PET film was used as the transparent substrate 10. A coating material for forming the first hard coat layer 22 and the second hard coat layer 24 was prepared by the following procedure. First, the following raw materials were prepared.

Reactive group-modified colloidal silica (dispersion medium: propylene glycol monomethyl ether acetate, nonvolatile content: 40% by weight): 100 parts by weight Dipentaerythritol hexaacrylate: 48 parts by weight 1,6-Hexanediol diacrylate: 12 parts by weight Photoinitiator (1-hydroxycyclohexyl phenyl ketone): 2.5 parts by weight The raw materials were diluted with a solvent (propylene glycol monomethyl ether (PGMA)) and mixed, and each component was dispersed in the solvent. Consequently, a coating material having a nonvolatile content (NV) of 25.5% by weight was prepared. The coating material prepared in this manner was used as the coating material for forming the first hard coat layer 22 and the second hard coat layer 24.

On one face of the transparent substrate 10, the coating material for forming the first hard coat layer 22 was applied, forming a coating. The solvent in the coating was removed in a hot-air dryer set at 80° C. The coating was irradiated with ultraviolet light at a cumulative light energy of 400 mJ/cm$^2$ with a UV treatment apparatus and was cured. In this manner, on one face of the transparent substrate 10, a first hard coat layer 22 having a thickness of 5 μm was formed. In the same manner, on the other face of the transparent substrate 10, a second hard coat layer 24 having a thickness of 5 μm was formed.

On the first hard coat layer 22, a first metal oxide layer 14, a metal layer 16, and a second metal oxide layer 18 were sequentially formed by DC magnetron sputtering. The first metal oxide layer 14 was formed by using an $Al_2O_3$—ZnO—$SnO_2$—$Ga_2O_3$ target. The first metal oxide layer 14 had a thickness of 40 nm. The metal layer 16 was formed by using an AgPdCu (Ag:Pd:Cu=99.0:0.5:0.5 (% by mass)) target. The metal layer 16 had a thickness of 9 nm. The second metal oxide layer 18 was formed by using the same target as that used for forming the first metal oxide layer 14. The second metal oxide layer 18 had a thickness of 40 nm.

A plurality of $Al_2O_3$—ZnO—$SnO_2$—$Ga_2O_3$ targets having various composition ratios were prepared, and samples 1 to 7 of the transparent conductor 101 were produced. As shown in Table 1, the first metal oxide layers 14 and the second metal oxide layers 18 included in the samples had various compositions. In Production Example 1, γ was changed in a range of 0 to 30% by mole where the $Al_2O_3$—ZnO—$SnO_2$—$Ga_2O_3$ target had a composition ratio of $[(Al_2O_3—ZnO)_{100}(SnO_2)_0]_{100-\gamma}(Ga_2O_3)_\gamma$, and a plurality of samples were produced. Here, the ratio of $Al_2O_3$, α, was fixed at 2% by mole. The compositions of the first metal oxide layer 14 and the second metal oxide layer 18 in Production Example 1 are as shown in Table 1. The compositions of the first metal oxide layer 14 and the second metal oxide layer 18 in Production Example 1 are indicated with open squares in the ternary diagram of FIG. 2.

(Evaluation of Transparent Conductor 101)

The total light transmittance at a wavelength of 555 nm was measured by a haze meter (trade name: NDH-7000, manufactured by NIPPON DENSHOKU INDUSTRIES CO., LTD.). Table 1 shows the results. A sample having a total light transmittance of 85% or more was evaluated as "A", and a sample having a total light transmittance of less than 85% was evaluated as "B". The surface resistance was measured by a four-probe resistivity meter (trade name: Loresta GP, manufactured by Mitsubishi Chemical Corporation). A sample having a surface resistance of 30 Ω/sq. or less was evaluated as "A", and a sample having a surface resistance of more than 30 Ω/sq. was evaluated as "B".

The etching characteristics were evaluated by the following procedure. First, an etching solution containing 56% by weight of phosphoric acid, 42% by weight of acetic acid, and 2% by weight of nitric acid was prepared. In the etching solution, the transparent conductor 101 was immersed at room temperature for 1 minute to be etched. The total light transmittance was measured at a wavelength of 555 nm to determine whether the metal oxide layers 12 and the metal layer 16 were dissolved. Specifically, after the etching, a sample having the same total light transmittance as that of the transparent substrate 10 alone was evaluated as "A", and a sample having a total light transmittance different from that of the transparent substrate 10 alone was evaluated as "B". The storage reliability was evaluated by storing the transparent conductor 101 in an environment at 85° C. and 85% RH for 50 hours. A transparent conductor 101 on which discoloration was visually observed after the storage was evaluated as "B", and a transparent conductor 101 on which no discoloration was visually observed after the storage was evaluated as "A". The haze values were measured with a haze meter before and after the storage.

As a result of the evaluations, a sample evaluated as "A" in all the evaluation items was comprehensively evaluated as "A", and a sample evaluated as "B" in at least one evaluation item was comprehensively evaluated as "B". In the remarks column, samples comprehensively evaluated as "A" are indicated with examples, and samples comprehensively evaluated as "B" are indicated with comparative examples. Table 1 shows the results.

TABLE 1

| | | Sample 1 | Sample 2 | Sample 3 | Sample 4 | Sample 5 | Sample 6 | Sample 7 |
|---|---|---|---|---|---|---|---|---|
| Second Metal Oxide Layer | $Al_2O_3$ (mol %) | 2.0 | 2.0 | 2.0 | 2.0 | 2.0 | 2.0 | 2.0 |
| | ZnO (mol %) | 98.0 | 93.0 | 88.0 | 83.0 | 78.0 | 73.0 | 68.0 |
| | $SnO_2$ (mol %) | 0.0 | 0.0 | 0.0 | 0.0 | 0.0 | 0.0 | 0.0 |
| | $Ga_2O_3$ (mol %) | 0.0 | 5.0 | 10.0 | 15.0 | 20.0 | 25.0 | 30.0 |
| | Film Thickness (nm) | 40 | 40 | 40 | 40 | 40 | 40 | 40 |
| Metal layer | Film Thickness (nm) | 9 | 9 | 9 | 9 | 9 | 9 | 9 |
| First Metal Oxide Layer | $Al_2O_3$ (mol %) | 2.0 | 2.0 | 2.0 | 2.0 | 2.0 | 2.0 | 2.0 |
| | ZnO (mol %) | 98.0 | 93.0 | 88.0 | 83.0 | 78.0 | 73.0 | 68.0 |
| | $SnO_2$ (mol %) | 0.0 | 0.0 | 0.0 | 0.0 | 0.0 | 0.0 | 0.0 |
| | $Ga_2O_3$ (mol %) | 0.0 | 5.0 | 10.0 | 15.0 | 20.0 | 25.0 | 30.0 |
| | Film Thickness (nm) | 40 | 40 | 40 | 40 | 40 | 40 | 40 |
| Total Light Transmittance (%) | | 89.3 | 89.0 | 88.6 | 88.2 | 87.7 | 87.2 | 86.3 |
| | | A | A | A | A | A | A | A |
| Surface Resistance (Ω/sq.) | | 10.3 | 11.3 | 11.3 | 11.2 | 11.3 | 11.1 | Unmeasurable |
| | | A | A | A | A | A | A | B |
| Etching Characteristics | | A | A | A | A | A | A | A |
| Storage Reliabilities | Haze (before storage) | 0.5 | 0.5 | 0.5 | 0.4 | 0.4 | 0.5 | 0.3 |
| | Haze (after storage) | 3.3 | 2.5 | 3.1 | 2.7 | 4.1 | 3.7 | 2.9 |
| | Evaluation | B | B | B | B | B | B | B |
| Comprehensive Evaluation | | B | B | B | B | B | B | B |
| Remarks | | Comparative Example | Comparative Example | Comparative Example | Comparative Example | Comparative Example | Comparative Example | Comparative Example |

As shown in Table 1, all the total light transmittances and the etching characteristics of samples 1 to 7 were evaluated as "A". However, the storage reliabilities of all the samples were evaluated as "B". On each sample, the whole film was discolored after the storage in an environment at 85° C. and 85% RH. The discoloration is considered to be caused by degradation of the metal oxide layer. With the discoloration, the haze value was significantly increased. Sample 7 containing 30% by mole of $Ga_2O_3$ had an unstable surface resistance, which was unmeasurable. This is considered to be because the electric conductivity of the metal oxide layer was largely decreased to lead to an insulating state. No sample was comprehensively evaluated as "A" where the composition ratio was $[(Al_2O_3—ZnO)_{100}(SnO_2)_0]_{100-\gamma}(Ga_2O_3)_\gamma$, and α was 2% by mole.

Production Example 2

In the same manner as in Production Example 1, on the first hard coat layer 22, a first metal oxide layer 14, a metal layer 16, and a second metal oxide layer 18 were sequentially formed by DC magnetron sputtering, giving samples 8 to 14 of the transparent conductor 101. In Production Example 2, γ was changed in a range of 0 to 30% by mole where the $Al_2O_3$—ZnO—$SnO_2$—$Ga_2O_3$ target had a composition ratio of $[(Al_2O_3-ZnO)_{95}(SnO_2)_5]_{100-\gamma}(Ga_2O_3)_\gamma$. Here, the ratio of $Al_2O_3$, α, was fixed at 2% by mole.

The compositions of the first metal oxide layer 14 and the second metal oxide layer 18 in Production Example 2 are as shown in Table 2. The compositions of the first metal oxide layer 14 and the second metal oxide layer 18 in Production Example 2 are indicated with open circles in the ternary diagram of FIG. 2. Each sample in Production Example 2 was evaluated in the same manner as in Production Example 1. Table 2 shows the results.

the haze value was significantly increased. From the above results, samples comprehensively evaluated as "A" had a $Ga_2O_3$ ratio of 10 to 25% by mole where the composition ratio was $[(Al_2O_3-ZnO)_{95}(SnO_2)_5]_{100-\gamma}(Ga_2O_3)_\gamma$, and α was 2% by mole. Sample 13 in Table 2 is represented by point a in FIG. 2, and sample 10 is represented by point b in FIG. 2.

Production Example 3

In the same manner as in Production Example 1, on the first hard coat layer 22, a first metal oxide layer 14, a metal layer 16, and a second metal oxide layer 18 were sequentially formed by DC magnetron sputtering, giving samples 15 to 21 of the transparent conductor 101. In Production

TABLE 2

| | | Sample 8 | Sample 9 | Sample 10 | Sample 11 | Sample 12 | Sample 13 | Sample 14 |
|---|---|---|---|---|---|---|---|---|
| Second Metal Oxide Layer | $Al_2O_3$ (mol %) | 2.0 | 2.0 | 2.0 | 2.0 | 2.0 | 2.0 | 2.0 |
| | ZnO (mol %) | 93.0 | 88.2 | 83.5 | 78.7 | 74.0 | 69.2 | 64.5 |
| | $SnO_2$ (mol %) | 5.0 | 4.8 | 4.5 | 4.3 | 4.0 | 3.8 | 3.5 |
| | $Ga_2O_3$ (mol %) | 0.0 | 5.0 | 10.0 | 15.0 | 20.0 | 25.0 | 30.0 |
| | Film Thickness (nm) | 40 | 40 | 40 | 40 | 40 | 40 | 40 |
| Metal layer | Film Thickness (nm) | 9 | 9 | 9 | 9 | 9 | 9 | 9 |
| First Metal Oxide Layer | $Al_2O_3$ (mol %) | 2.0 | 2.0 | 2.0 | 2.0 | 2.0 | 2.0 | 2.0 |
| | ZnO (mol %) | 93.0 | 88.2 | 83.5 | 78.7 | 74.0 | 69.2 | 64.5 |
| | $SnO_2$ (mol %) | 5.0 | 4.8 | 4.5 | 4.3 | 4.0 | 3.8 | 3.5 |
| | $Ga_2O_3$ (mol %) | 0.0 | 5.0 | 10.0 | 15.0 | 20.0 | 25.0 | 30.0 |
| | Film Thickness (nm) | 40 | 40 | 40 | 40 | 40 | 40 | 40 |
| Total Light Transmittance (%) | | 89.3 | 89.0 | 88.6 | 88.2 | 87.7 | 87.2 | 86.6 |
| | | A | A | A | A | A | A | A |
| Surface Resistance (Ω/sq.) | | 11.2 | 10.9 | 11.1 | 11.2 | 11.0 | 11.1 | Unmeasurable |
| | | A | A | A | A | A | A | B |
| Etching Characteristics | | A | A | A | A | A | A | A |
| Storage Reliabilities | Haze (before storage) | 0.4 | 0.3 | 0.4 | 0.5 | 0.3 | 0.5 | 0.5 |
| | Haze (after storage) | 3.6 | 1.4 | 0.4 | 0.5 | 0.3 | 0.5 | 0.5 |
| | Evaluation | B | B | A | A | A | A | A |
| Comprehensive Evaluation | | B | B | A | A | A | A | B |
| Remarks | | Comparative Example | Comparative Example | Example | Example | Example | Example | Comparative Example |

As shown in Table 2, all the total light transmittances and the etching characteristics of samples 8 to 14 were evaluated as "A". Sample 14 containing 30% by mole of $Ga_2O_3$ had an unstable surface resistance, which was unmeasurable. This is considered to be because the electric conductivity of the metal oxide layer was largely decreased to lead to an insulating state. As for the storage reliability of the samples, samples 8 and 9 containing 0 to 5% by mole of $Ga_2O_3$ were evaluated as "B". This is because the whole film was discolored after the storage in an environment at 85° C. and 85% RH. The discoloration is considered to be caused by degradation of the metal oxide layer. With the discoloration, Example 3, γ was changed in a range of 0 to 30% by mole where the $Al_2O_3$—ZnO—$SnO_2$—$Ga_2O_3$ target had a composition ratio of $[(Al_2O_3-ZnO)_{90}(SnO_2)_{10}]_{100-\gamma}(Ga_2O_3)_\gamma$. Here, the ratio of $Al_2O_3$, α, was fixed at 2% by mole.

The compositions of the first metal oxide layer 14 and the second metal oxide layer 18 in Production Example 3 are as shown in Table 3. The compositions of the first metal oxide layer 14 and the second metal oxide layer 18 in Production Example 3 are indicated with triangles in the ternary diagram of FIG. 2. Each sample in Production Example 3 was evaluated in the same manner as in Production Example 1. Table 3 shows the results.

TABLE 3

| | | Sample 15 | Sample 16 | Sample 17 | Sample 18 | Sample 19 | Sample 20 | Sample 21 |
|---|---|---|---|---|---|---|---|---|
| Second Metal Oxide Layer | $Al_2O_3$ (mol %) | 2.0 | 2.0 | 2.0 | 2.0 | 2.0 | 2.0 | 2.0 |
| | ZnO (mol %) | 88.0 | 83.5 | 79.0 | 74.5 | 70.0 | 65.5 | 61.0 |
| | $SnO_2$ (mol %) | 10.0 | 9.5 | 9.0 | 8.5 | 8.0 | 7.5 | 7.0 |
| | $Ga_2O_3$ (mol %) | 0.0 | 5.0 | 10.0 | 15.0 | 20.0 | 25.0 | 30.0 |
| | Film Thickness (nm) | 40 | 40 | 40 | 40 | 40 | 40 | 40 |
| Metal layer | Film Thickness (nm) | 9 | 9 | 9 | 9 | 9 | 9 | 9 |
| First Metal Oxide Layer | $Al_2O_3$ (mol %) | 2.0 | 2.0 | 2.0 | 2.0 | 2.0 | 2.0 | 2.0 |
| | ZnO (mol %) | 88.0 | 83.5 | 79.0 | 74.5 | 70.0 | 65.5 | 61.0 |
| | $SnO_2$ (mol %) | 10.0 | 9.5 | 9.0 | 8.5 | 8.0 | 7.5 | 7.0 |
| | $Ga_2O_3$ (mol %) | 0.0 | 5.0 | 10.0 | 15.0 | 20.0 | 25.0 | 30.0 |
| | Film Thickness (nm) | 40 | 40 | 40 | 40 | 40 | 40 | 40 |
| Total Light Transmittance (%) | | 89.5 | 89.2 | 88.8 | 88.2 | 87.7 | 87.2 | 86.6 |
| | | A | A | A | A | A | A | A |

TABLE 3-continued

|  | Sample 15 | Sample 16 | Sample 17 | Sample 18 | Sample 19 | Sample 20 | Sample 21 |
|---|---|---|---|---|---|---|---|
| Surface Resistance (Ω/sq.) | 11.2 | 11.1 | 11.1 | 11.4 | 11.3 | 11 | Unmeasurable |
|  | A | A | A | A | A | A | B |
| Etching Characteristics | A | A | A | A | A | A | A |
| Storage Reliabilities Haze (before storage) | 0.3 | 0.4 | 0.3 | 0.4 | 0.5 | 0.4 | 0.4 |
| Storage Reliabilities Haze (after storage) | 0.3 | 0.4 | 0.3 | 0.4 | 0.5 | 0.4 | 0.4 |
| Evaluation | A | A | A | A | A | A | A |
| Comprehensive Evaluation | B | B | A | A | A | A | B |
| Remarks | Comparative Example | Comparative Example | Example | Example | Example | Example | Comparative Example |

As shown in Table 3, all the total light transmittances and the etching characteristics of samples 15 to 21 were evaluated as "A". Sample 21 containing 30% by mole of $Ga_2O_3$ had an unstable surface resistance, which was unmeasurable. This is considered to be because the electric conductivity of the metal oxide layer was largely decreased to lead to an insulating state. As for the storage reliability of the samples, samples 15 and 16 containing 0 to 5% by mole of $Ga_2O_3$ were evaluated as "B". This is because the whole film was discolored after the storage in an environment at 85° C. and 85% RH. The discoloration is considered to be caused by degradation of the metal oxide layer. With the discoloration, the haze value was significantly increased. As shown in Table 3, samples comprehensively evaluated as "A" had a $Ga_2O_3$ ratio of 10 to 25% by mole where the composition ratio was $[(Al_2O_3-ZnO)_{90}(SnO_2)_{10}]_{100-\gamma}(Ga_2O_3)_\gamma$, and α was 2% by mole. Sample 20 in Table 3 is represented by point f in FIG. 2.

Production Example 4

In the same manner as in Production Example 1, on the first hard coat layer 22, a first metal oxide layer 14, a metal layer 16, and a second metal oxide layer 18 were sequentially formed by DC magnetron sputtering, giving samples 22 to 28 of the transparent conductor 101. In Production Example 4, γ was changed in a range of 0 to 30% by mole where the $Al_2O_3$—ZnO—$SnO_2$—$Ga_2O_3$ target had a composition ratio of $[(Al_2O_3-ZnO)_{80}(SnO_2)_{20}]_{100-\gamma}(Ga_2O_3)_\gamma$. Here, the ratio of $Al_2O_3$, α, was fixed at 2% by mole.

The compositions of the first metal oxide layer 14 and the second metal oxide layer 18 in Production Example 4 are as shown in Table 4. The compositions of the first metal oxide layer 14 and the second metal oxide layer 18 in Production Example 4 are indicated with rhombuses in the ternary diagram of FIG. 2. Each sample in Production Example 4 was evaluated in the same manner as in Production Example 1. Table 4 shows the results.

TABLE 4

|  |  | Sample 22 | Sample 23 | Sample 24 | Sample 25 | Sample 26 | Sample 27 | Sample 28 |
|---|---|---|---|---|---|---|---|---|
| Second Metal Oxide Layer | $Al_2O_3$ (mol %) | 2.0 | 2.0 | 2.0 | 2.0 | 2.0 | 2.0 | 2.0 |
| Second Metal Oxide Layer | ZnO (mol %) | 78.0 | 74.0 | 70.0 | 66.0 | 62.0 | 58.0 | 54.0 |
| Second Metal Oxide Layer | $SnO_2$ (mol %) | 20.0 | 19.0 | 18.0 | 17.0 | 16.0 | 15.0 | 14.0 |
| Second Metal Oxide Layer | $Ga_2O_3$ (mol %) | 0.0 | 5.0 | 10.0 | 15.0 | 20.0 | 25.0 | 30.0 |
| Second Metal Oxide Layer | Film Thickness (nm) | 40 | 40 | 40 | 40 | 40 | 40 | 40 |
| Metal layer | Film Thickness (nm) | 9 | 9 | 9 | 9 | 9 | 9 | 9 |
| First Metal Oxide Layer | $Al_2O_3$ (mol %) | 2.0 | 2.0 | 2.0 | 2.0 | 2.0 | 2.0 | 2.0 |
| First Metal Oxide Layer | ZnO (mol %) | 78.0 | 74.0 | 70.0 | 66.0 | 62.0 | 58.0 | 54.0 |
| First Metal Oxide Layer | $SnO_2$ (mol %) | 20.0 | 19.0 | 18.0 | 17.0 | 16.0 | 15.0 | 14.0 |
| First Metal Oxide Layer | $Ga_2O_3$ (mol %) | 0.0 | 5.0 | 10.0 | 15.0 | 20.0 | 25.0 | 30.0 |
| First Metal Oxide Layer | Film Thickness (nm) | 40 | 40 | 40 | 40 | 40 | 40 | 40 |
| Total Light Transmittance (%) |  | 89.6 | 89.2 | 88.8 | 88.4 | 88.0 | 87.5 | 86.9 |
|  |  | A | A | A | A | A | A | A |
| Surface Resistance (Ω/sq.) |  | 11.4 | 11.0 | 11.3 | 11.2 | 11.1 | Unmeasurable | Unmeasurable |
|  |  | A | A | A | A | A | B | B |
| Etching Characteristics |  | A | A | A | A | A | A | A |
| Storage Reliabilities | Haze (before storage) | 0.4 | 0.4 | 0.4 | 0.5 | 0.5 | 0.5 | 0.4 |
| Storage Reliabilities | Haze (after storage) | 1.8 | 0.4 | 0.4 | 0.5 | 0.5 | 0.5 | 0.4 |
|  | Evaluation | B | A | A | A | A | A | A |
| Comprehensive Evaluation |  | B | A | A | A | A | B | B |
| Remarks |  | Comparative Example | Example | Example | Example | Example | Comparative Example | Comparative Example |

As shown in Table 4, all the total light transmittances and the etching characteristics of samples 22 to 28 were evaluated as "A". Samples 27 and 28 containing 25% by mole and 30% by mole of $Ga_2O_3$, respectively, had unstable surface resistances, which were unmeasurable. This is considered to be because the electric conductivity of each metal oxide layer was largely decreased to lead to an insulating state. As for the storage reliability of the samples, sample 22 containing 0% by mole of $Ga_2O_3$ was evaluated as "B". This is because the whole film was discolored after the storage in an environment at 85° C. and 85% RH. The discoloration is considered to be caused by degradation of the metal oxide layer. With the discoloration, the haze value was significantly increased. As shown in Table 4, samples comprehensively evaluated as "A" had a $Ga_2O_3$ ratio of 5 to 20% by mole where the composition ratio was $[(Al_2O_3-ZnO)_{80}(SnO_2)_{20}]_{100-\gamma}(Ga_2O_3)_\gamma$, and α was 2% by mole. Sample 23 in Table 4 is represented by point c in FIG. 2.

Production Example 5

In the same manner as in Production Example 1, on the first hard coat layer 22, a first metal oxide layer 14, a metal layer 16, and a second metal oxide layer 18 were sequentially formed by DC magnetron sputtering, giving samples 29 to 35 of the transparent conductor 101. In Production Example 5, γ was changed in a range of 0 to 30% by mole where the $Al_2O_3$—ZnO—$SnO_2$—$Ga_2O_3$ target had a composition ratio of $[(Al_2O_3-ZnO)_{70}(SnO_2)_{30}]_{100-\gamma}(Ga_2O_3)_\gamma$. Here, the ratio of $Al_2O_3$, α, was fixed at 2% by mole.

The compositions of the first metal oxide layer 14 and the second metal oxide layer 18 in Production Example 5 are as shown in Table 5. The compositions of the first metal oxide layer 14 and the second metal oxide layer 18 in Production Example 5 are indicated with black squares in the ternary diagram of FIG. 2. Each sample in Production Example 5 was evaluated in the same manner as in Production Example 1. Table 5 shows the results.

sively evaluated as "A" had a $Ga_2O_3$ ratio of 5 to 15% by mole where the composition ratio was $[(Al_2O_3-ZnO)_{70}(SnO_2)_{30}]_{100-\gamma}(Ga_2O_3)_\gamma$, and α was 2% by mole. Sample 30 in Table 5 is represented by point d in FIG. 2, and sample 32 is represented by point e.

Production Example 6

In the same manner as in Production Example 1, on the first hard coat layer 22, a first metal oxide layer 14, a metal layer 16, and a second metal oxide layer 18 were sequentially formed by DC magnetron sputtering, giving samples 36 to 42 of the transparent conductor 101. In Production Example 6, γ was changed in a range of 0 to 30% by mole

TABLE 5

| | | Sample 29 | Sample 30 | Sample 31 | Sample 32 | Sample 33 | Sample 34 | Sample 35 |
|---|---|---|---|---|---|---|---|---|
| Second Metal Oxide Layer | $Al_2O_3$ (mol %) | 2.0 | 2.0 | 2.0 | 2.0 | 2.0 | 2.0 | 2.0 |
| | ZnO (mol %) | 68.0 | 64.5 | 61.0 | 57.5 | 54.0 | 50.5 | 47.0 |
| | $SnO_2$ (mol %) | 30.0 | 28.5 | 27.0 | 25.5 | 24.0 | 22.5 | 21.0 |
| | $Ga_2O_3$ (mol %) | 0.0 | 5.0 | 10.0 | 15.0 | 20.0 | 25.0 | 30.0 |
| | Film Thickness (nm) | 40 | 40 | 40 | 40 | 40 | 40 | 40 |
| Metal layer | Film Thickness (nm) | 9 | 9 | 9 | 9 | 9 | 9 | 9 |
| First Metal Oxide Layer | $Al_2O_3$ (mol %) | 2.0 | 2.0 | 2.0 | 2.0 | 2.0 | 2.0 | 2.0 |
| | ZnO (mol %) | 68.0 | 64.5 | 61.0 | 57.5 | 54.0 | 50.5 | 47.0 |
| | $SnO_2$ (mol %) | 30.0 | 28.5 | 27.0 | 25.5 | 24.0 | 22.5 | 21.0 |
| | $Ga_2O_3$ (mol %) | 0.0 | 5.0 | 10.0 | 15.0 | 20.0 | 25.0 | 30.0 |
| | Film Thickness (nm) | 40 | 40 | 40 | 40 | 40 | 40 | 40 |
| Total Light Transmittance (%) | | 89.6 | 89.3 | 89.0 | 88.6 | 88.2 | 87.5 | 86.9 |
| | | A | A | A | A | A | A | A |
| Surface Resistance (Ω/sq.) | | 11.2 | 11.1 | 11.3 | 11.2 | Unmeasurable | Unmeasurable | Unmeasurable |
| | | A | A | A | A | B | B | B |
| Etching Characteristics | | B | A | A | A | A | A | A |
| Storage Reliabilities | Haze (before storage) | 0.4 | 0.3 | 0.3 | 0.4 | 0.5 | 0.4 | 0.3 |
| | Haze (after storage) | 0.4 | 0.3 | 0.3 | 0.4 | 0.5 | 0.4 | 0.3 |
| | Evaluation | A | A | A | A | A | A | A |
| Comprehensive Evaluation | | B | A | A | A | B | B | B |
| Remarks | | Comparative Example | Example | Example | Example | Comparative Example | Comparative Example | Comparative Example |

As shown in Table 5, all the total light transmittances and the storage reliabilities of samples 29 to 35 were evaluated as "A". Samples 33 to 35 containing 20 to 30% by mole of $Ga_2O_3$ had unstable surface resistances, which were unmeasurable. This is considered to be because the electric conductivity of each metal oxide layer was largely decreased to lead to an insulating state. As for the etching characteristics of the samples, sample 29 containing 0% by mole of $Ga_2O_3$ was evaluated as "B". This is because the first and second metal oxide layers 14 and 18 were not dissolved in the etching solution. As shown in Table 5, samples comprehenwhere the $Al_2O_3$—ZnO—$SnO_2$—$Ga_2O_3$ target had a composition ratio of $[(Al_2O_3-ZnO)_{70}(SnO_2)_{30}]_{100-\gamma}(Ga_2O_3)_\gamma$. Here, the ratio of $Al_2O_3$, α, was fixed at 2% by mole.

The compositions of the first metal oxide layer 14 and the second metal oxide layer 18 in Production Example 6 are as shown in Table 6. The compositions of the first metal oxide layer 14 and the second metal oxide layer 18 in Production Example 6 are indicated with black circles in the ternary diagram of FIG. 2. Each sample in Production Example 6 was evaluated in the same manner as in Production Example 1. Table 6 shows the results.

TABLE 6

| | | Sample 36 | Sample 37 | Sample 38 | Sample 39 | Sample 40 | Sample 41 | Sample 42 |
|---|---|---|---|---|---|---|---|---|
| Second Metal Oxide Layer | $Al_2O_3$ (mol %) | 2.0 | 2.0 | 2.0 | 2.0 | 2.0 | 2.0 | 2.0 |
| | ZnO (mol %) | 58.0 | 55.0 | 52.0 | 49.0 | 46.0 | 43.0 | 40.0 |
| | $SnO_2$ (mol %) | 40.0 | 38.0 | 36.0 | 34.0 | 32.0 | 30.0 | 28.0 |
| | $Ga_2O_3$ (mol %) | 0.0 | 5.0 | 10.0 | 15.0 | 20.0 | 25.0 | 30.0 |
| | Film Thickness (nm) | 40 | 40 | 40 | 40 | 40 | 40 | 40 |
| Metal layer | Film Thickness (nm) | 9 | 9 | 9 | 9 | 9 | 9 | 9 |

TABLE 6-continued

|  |  | Sample 36 | Sample 37 | Sample 38 | Sample 39 | Sample 40 | Sample 41 | Sample 42 |
|---|---|---|---|---|---|---|---|---|
| First Metal Oxide Layer | $Al_2O_3$ (mol %) | 2.0 | 2.0 | 2.0 | 2.0 | 2.0 | 2.0 | 2.0 |
|  | ZnO (mol %) | 58.0 | 55.0 | 52.0 | 49.0 | 46.0 | 43.0 | 40.0 |
|  | $SnO_2$ (mol %) | 40.0 | 38.0 | 36.0 | 34.0 | 32.0 | 30.0 | 28.0 |
|  | $Ga_2O_3$ (mol %) | 0.0 | 5.0 | 10.0 | 15.0 | 20.0 | 25.0 | 30.0 |
|  | Film Thickness (nm) | 40 | 40 | 40 | 40 | 40 | 40 | 40 |
| Total Light Transmittance (%) |  | 89.7 | 89.5 | 89.2 | 88.6 | 88.2 | 87.7 | 87.2 |
|  |  | A | A | A | A | A | A | A |
| Surface Resistance (Ω/sq.) |  | 11.1 | Unmeasurable | Unmeasurable | Unmeasurable | Unmeasurable | Unmeasurable | Unmeasurable |
|  |  | A | B | B | B | B | B | B |
| Etching Characteristics |  | B | B | B | B | B | B | A |
| Storage Reliabilities | Haze (before storage) | 0.3 | 0.3 | 0.4 | 0.5 | 0.4 | 0.4 | 0.4 |
|  | Haze (after storage) | 0.3 | 0.3 | 0.4 | 0.5 | 0.4 | 0.4 | 0.4 |
|  | Evaluation | A | A | A | A | A | A | A |
| Comprehensive Evaluation |  | B | B | B | B | B | B | B |
| Remarks |  | Comparative Example | Comparative Example | Comparative Example | Comparative Example | Comparative Example | Comparative Example | Comparative Example |

As shown in Table 6, all the total light transmittances and the storage reliabilities of samples 36 to 42 were evaluated as "A". However, samples 37 to 42 containing 5 to 30% by mole of $Ga_2O_3$ had unstable surface resistances, which were unmeasurable. This is considered to be because the electric conductivity of each metal oxide layer was largely decreased to lead to an insulating state. The etching characteristics of samples 36 to 41 were "B". This is because the first metal oxide layer 14 and the second metal oxide layer 18 were not dissolved in the etching solution. As shown in Table 6, no sample containing $Ga_2O_3$ at any ratio was comprehensively evaluated as "A" where the composition ratio was $[(Al_2O_3—ZnO)_{60}(SnO_2)_{40}]_{100-\gamma}(Ga_2O_3)_\gamma$, and α was 2% by mole.

Production Example 7

In the same manner as in Production Example 1, on the first hard coat layer 22, a first metal oxide layer 14, a metal layer 16, and a second metal oxide layer 18 were sequentially formed by DC magnetron sputtering, giving samples 43 to 48 of the transparent conductor 101. In Production Example 7, the ratio of $Al_2O_3$, α, was changed in a range of 0 to 6% by mole where the $Al_2O_3$—ZnO—$SnO_2$—$Ga_2O_3$ target had a composition ratio of $[(Al_2O_3—ZnO)_{90}(SnO_2)_{10}]_{100-\gamma}(Ga_2O_3)_\gamma$, and γ was 20% by mole.

The compositions of the first metal oxide layer 14 and the second metal oxide layer 18 in Production Example 7 are as shown in Table 7. Each sample in Production Example 7 was evaluated in the same manner as in Production Example 1. Table 7 shows the results. The sample 45 in which α was 2% by mole is the same as sample 19 in Table 3.

TABLE 7

|  |  | Sample 43 | Sample 44 | Sample 45 | Sample 46 | Sample 47 | Sample 48 |
|---|---|---|---|---|---|---|---|
| Second Metal Oxide Layer | $Al_2O_3$ (mol %) | 0.0 | 1.5 | 2.0 | 3.5 | 4.0 | 6.0 |
|  | ZnO (mol %) | 72.0 | 70.5 | 70.0 | 68.5 | 68.0 | 66.0 |
|  | $SnO_2$ (mol %) | 8.0 | 8.0 | 8.0 | 8.0 | 8.0 | 8.0 |
|  | $Ga_2O_3$ (mol %) | 20.0 | 20.0 | 20.0 | 20.0 | 20.0 | 20.0 |
|  | Film Thickness (nm) | 40 | 40 | 40 | 40 | 40 | 40 |
| Metal layer | Film Thickness (nm) | 9 | 9 | 9 | 9 | 9 | 9 |
| First Metal Oxide Layer | $Al_2O_3$ (mol %) | 0.0 | 1.5 | 2.0 | 3.5 | 4.0 | 6.0 |
|  | ZnO (mol %) | 72.0 | 70.5 | 70.0 | 68.5 | 68.0 | 66.0 |
|  | $SnO_2$ (mol %) | 8.0 | 8.0 | 8.0 | 8.0 | 8.0 | 8.0 |
|  | $Ga_2O_3$ (mol %) | 20.0 | 20.0 | 20.0 | 20.0 | 20.0 | 20.0 |
|  | Film Thickness (nm) | 40 | 40 | 40 | 40 | 40 | 40 |
| Total Light Transmittance (%) |  | 89.4 | 89.4 | 87.7 | 89.3 | 89.4 | 89.2 |
|  |  | A | A | A | A | A | A |
| Surface Resistance (Ω/sq.) |  | Unmeasurable | 11.4 | 11.3 | 11.3 | Unmeasurable | Unmeasurable |
|  |  | B | A | A | A | B | B |
| Etching Characteristics |  | A | A | A | A | A | A |
| Storage Reliabilities | Haze (before storage) | 0.4 | 0.4 | 0.3 | 0.5 | 0.4 | 0.4 |
|  | Haze (after storage) | 0.4 | 0.4 | 0.3 | 0.5 | 0.4 | 0.4 |
|  | Evaluation | A | A | A | A | A | A |
| Comprehensive Evaluation |  | B | A | A | A | B | B |
| Remarks |  | Comparative Example | Example | Example | Example | Comparative Example | Comparative Example |

As shown in Table 7, all the total light transmittances, the etching characteristics, and the storage reliabilities of samples 43 to 48 were evaluated as "A". However, samples 43, 47, and 48 containing 0 and 4.0 to 6.0% by mole of $Al_2O_3$ had unstable surface resistances, which were unmeasurable. This is considered to be because the electric conductivity of each metal oxide layer was largely decreased to lead to an insulating state. As shown in Table 7, samples comprehensively evaluated as "A" had an $Al_2O_3$ ratio of 1.5 to 3.5% by mole where the composition ratio was $[(Al_2O_3—ZnO)_{90}(SnO_2)_{10}]_{80}(Ga_2O_3)_{20}$.

Production Example 8

In the same manner as in Production Example 1, on the first hard coat layer 22, a first metal oxide layer 14, a metal layer 16, and a second metal oxide layer 18 were sequentially formed by DC magnetron sputtering, giving samples 49 to 54 of the transparent conductor 101. In Production Example 8, the ratio of $Al_2O_3$, α, was changed in a range of 0 to 6% by mole where the $Al_2O_3$—ZnO—$SnO_2$—$Ga_2O_3$ target had a composition ratio of $[(Al_2O_3—ZnO)_{70}(SnO_2)_{30}]_{100-γ}(Ga_2O_3)_γ$, and γ was 5% by mole.

The compositions of the first metal oxide layer 14 and the second metal oxide layer 18 in Production Example 8 are as shown in Table 8. Each sample in Production Example 8 was evaluated in the same manner as in Production Example 1. Table 8 shows the results. The sample 51 in which α was 2% by mole is the same as sample 30 in Table 5. These samples are represented by point d in FIG. 2.

transmittance and etching characteristics but poor storage reliability. The addition of $SnO_2$ and $Ga_2O_3$ at a predetermined range enables a significant improvement in the storage reliability. However, excessive amounts of them lower the electric conductivity. In addition, an excessive amount of $SnO_2$ is likely to lower the etching characteristics. The addition of $Al_2O_3$ in a predetermined amount enables an increase in the electric conductivity and an improvement in the surface resistance.

What is claimed is:

1. A transparent conductor comprising:
a transparent substrate;
a first metal oxide layer;
a metal layer; and
a second metal oxide layer laminated in this order,
wherein
a composition of at least one of the first metal oxide layer and the second metal oxide layer contains four components of $Al_2O_3$, ZnO, $SnO_2$, and $Ga_2O_3$,
a total amount of the four components is 99% by mass or more based on a total mass of the composition,
X, Y, and Z are within a region surrounded by and including line segments between point a (71.2, 3.8, 25.0), point b (85.5, 4.5, 10.0), point c (76.0, 19.0, 5.0), point d (66.5, 28.5, 5.0), point e (59.5, 25.5, 15.0), and point f (67.5, 7.5, 25.0), in terms of (X, Y, Z) coordinates shown in a ternary diagram in FIG. 2,

TABLE 8

|  |  | Sample 49 | Sample 50 | Sample 51 | Sample 52 | Sample 53 | Sample 54 |
|---|---|---|---|---|---|---|---|
| Second | $Al_2O_3$ (mol %) | 0.0 | 1.5 | 2.0 | 3.5 | 4.0 | 6.0 |
| Metal | ZnO (mol %) | 66.5 | 65.0 | 64.5 | 63.0 | 62.5 | 60.5 |
| Oxide | $SnO_2$ (mol %) | 28.5 | 28.5 | 28.5 | 28.5 | 28.5 | 28.5 |
| Layer | $Ga_2O_3$ (mol %) | 5.0 | 5.0 | 5.0 | 5.0 | 5.0 | 5.0 |
|  | Film Thickness (nm) | 40 | 40 | 40 | 40 | 40 | 40 |
| Metal layer | Film Thickness (nm) | 9 | 9 | 9 | 9 | 9 | 9 |
| First Metal | $Al_2O_3$ (mol %) | 0.0 | 1.5 | 2.0 | 3.5 | 4.0 | 6.0 |
| Oxide | ZnO (mol %) | 66.5 | 65.0 | 64.5 | 63.0 | 62.5 | 60.5 |
| Layer | $SnO_2$ (mol %) | 28.5 | 28.5 | 28.5 | 28.5 | 28.5 | 28.5 |
|  | $Ga_2O_3$ (mol %) | 5.0 | 5.0 | 5.0 | 5.0 | 5.0 | 5.0 |
|  | Film Thickness (nm) | 40 | 40 | 40 | 40 | 40 | 40 |
| Total Light Transmittance (%) |  | 88.4 | 89.0 | 89.3 | 89.3 | 89.1 | 89.2 |
|  |  | A | A | A | A | A | A |
| Surface Resistance (Ω/sq.) |  | Unmeasurable | 10.8 | 11.1 | 10.9 | Unmeasurable | Unmeasurable |
|  |  | B | A | A | A | B | B |
| Etching Characteristics |  | A | A | A | A | A | A |
| Storage | Haze (before storage) | 0.3 | 0.3 | 0.4 | 0.5 | 0.4 | 0.5 |
| Reliabilities | Haze (after storage) | 0.3 | 0.3 | 0.4 | 0.5 | 0.4 | 0.5 |
|  | Evaluation | A | A | A | A | A | A |
| Comprehensive Evaluation |  | B | A | A | A | B | B |
| Remarks |  | Comparative Example | Example | Example | Example | Comparative Example | Comparative Example |

As shown in Table 8, all the total light transmittances, the etching characteristics, and the storage reliabilities of samples 49 to 54 were evaluated as "A". However, samples 49, 53, and 54 containing 0 and 4.0 to 6.0% by mole of $Al_2O_3$ had unstable surface resistances, which were unmeasurable. This is considered to be because the electric conductivity of each metal oxide layer was largely decreased to lead to an insulating state. As shown in Table 8, samples comprehensively evaluated as "A" had an $Al_2O_3$ ratio of 1.5 to 3.5% by mole where the composition ratio was $[(Al_2O_3—ZnO)_{70}(SnO_2)_{30}]_{95}(Ga_2O_3)_5$.

From the above results, the samples containing ZnO and $Al_2O_3$ alone were ascertained to have good total light where X is a total molar ratio of the $Al_2O_3$ and the ZnO, Y is a molar ratio of the $SnO_2$, and Z is a molar ratio of the $Ga_2O_3$, relative to the total amount of the four components, and
a molar ratio of the $Al_2O_3$ relative to the total amount of the four components is 1.5 to 3.5% by mole.

2. A touch panel comprising:
a panel plate; and
a sensor film that is opposite to the panel plate and is the transparent conductor according to claim 1.

* * * * *